(12) United States Patent
Mizuniwa et al.

(10) Patent No.: US 6,409,831 B2
(45) Date of Patent: Jun. 25, 2002

(54) APPARATUS FOR FABRICATING SINGLE CRYSTAL

(75) Inventors: Seiji Mizuniwa; Kenya Itani; Michinori Wachi, all of Hitachi (JP)

(73) Assignee: Hitachi Cable Ltd., Tokyo (JP)

( * ) Notice: Subject to any disclaimer, the term of this patent is extended or adjusted under 35 U.S.C. 154(b) by 0 days.

(21) Appl. No.: 09/820,877

(22) Filed: Mar. 30, 2001

Related U.S. Application Data

(62) Division of application No. 09/325,129, filed on Jun. 3, 1999, now Pat. No. 6,290,773.

(30) Foreign Application Priority Data

Jun. 3, 1998 (JP) .......................... 10-154014

(51) Int. Cl.$^7$ ............................................. C30B 35/00
(52) U.S. Cl. ........................... 117/204; 117/81; 117/83; 117/900
(58) Field of Search ............................ 117/81, 83, 200, 117/900

(56) References Cited

U.S. PATENT DOCUMENTS

| | | |
|---|---|---|
| 4,925,636 A | 5/1990 | Hemmerdinger et al. |
| 5,135,726 A | 8/1992 | Min et al. |
| 5,169,486 A * | 12/1992 | Young et al. .................. 117/83 |
| 5,685,907 A * | 11/1997 | Fujikawa et al. ............ 117/205 |
| 5,698,029 A | 12/1997 | Fujikawa et al. ............ 117/204 |

FOREIGN PATENT DOCUMENTS

| | | |
|---|---|---|
| GB | 2090545 A | 7/1982 |
| GB | 2097695 A | 11/1982 |

* cited by examiner

*Primary Examiner*—Felisa Hiteshew
(74) *Attorney, Agent, or Firm*—Antonelli, Terry, Stout & Kraus, LLP

(57) ABSTRACT

This invention relates to fabrication of a single crystal of a compound semiconductor according to the vertical Bridgman method which improves a recess in the interface between solid and melt and can obtain a stable yield of single crystal growth characterized in that a part for discharging the heat of a crucible to the outside in the radial direction is formed at least in a part in the circumferential direction of a heater part for controlling the interface between solid and melt in a heater which surrounds the crucible and a semiconductor melt is gradually solidified from a lower part to an upper part in the crucible while maintaining the interface between solid and melt in a saddle shape, thereby growing a single crystal.

5 Claims, 2 Drawing Sheets

APPARATUS FOR FABRICATING SINGLE CRYSTAL

This application is a Divisional application of application Ser. No. 09/325,129, filed Jun. 3, 1999, now U.S. Pat. No. 6,290,773.

BACKGROUND OF THE INVENTION

1. Field of the Invention

The present invention relates to method and apparatus for fabricating a single crystal of a compound semiconductor according to the vertical Bridgman method of growing a single crystal by gradually solidifying a semiconductor melt from a lower part to an upper part in a crucible.

2. Description of Related Art

In recent years, attention is being paid to the vertical Bridgman method as a method of obtaining a large GaAs crystal having the diameter exceeding 3 inches and a low dislocation density. According to the vertical Bridgman method, a crucible for containing a material and a seed crystal (seed) is placed on the inside of a heater of a vertical electric furnace and the material in the upper part is melt. After that, the seed is dipped into the melt and a single crystal is grown in the crucible from a lower part to an upper part, that is, from a lower part on the seed crystal side to an upper part.

The method of growing a crystal by moving the crucible and the heater relatively to each other is called the VB (vertical Bridgman) method. A method of growing a crystal by providing a temperature gradient in which the temperature is high in the upper part and is low in a lower part and decreasing the temperature as a whole while maintaining the temperature gradient constant is called a VGF (vertical gradient freezing) method.

In case of growing a single crystal of GaAs, a method of floating $B_2O_3$ on the surface of the material in order to prevent dissociation of As or a method of encapsulating the entire crucible in a quartz ampoule and growing a single crystal while maintaining the pressure at 1 atm which is a dissociation pressure of As in GaAs in the ampoule is employed.

In any case, as a heater of a part for controlling the interface between solid and melt, a heater which continues uniformly without a gap in the circumferential direction, that is, a heater having a circular shape in cross section is used for the following reason. For example, when there is variation in temperature in the circumferential direction, the interface between solid and melt becomes flat. It is therefore considered that variation in the electrical characteristics of the plane of a wafer which is cut from the crystal becomes large.

As a result of wholehearted studies of the inventors of the present invention, it was found that when the rounded heater is used, the interface between solid and melt tends to become recessed as a whole and there is a drawback that the yield of single crystal growth deteriorates.

SUMMARY OF THE INVENTION

It is, therefore, an object of the present invention to provide method and apparatus for fabricating a single crystal according to the vertical Bridgman method which solves the above problem of the recessed interface between solid and melt and can obtain a stable yield of single crystal growth.

In order to achieve the object, the invention is constructed as follows.

(1) There is provided a method of fabricating a single crystal of a compound semiconductor according to the vertical Bridgman method of growing a single crystal by arranging a crucible on the inner side of a heater of a vertical electrical furnace and gradually solidifying a semiconductor melt from a lower part to an upper part in the crucible, wherein a part for discharging the heat of the crucible toward the outside in the radial direction is formed at least in a part in the circumferential direction of a heater part for controlling the interface between solid and melt in the above heater which surrounds the crucible and the semiconductor melt is gradually solidified from a lower part to an upper part in the crucible while discharging the heat of the crucible not only in the vertical direction but also to the outside in the radial direction, thereby growing a single crystal.

The vertical Bridgman method includes the vertical gradient freezing method (VGF method) of growing a crystal only with temperature decrease, the vertical Bridgman method (VB method) of growing a crystal by relatively descending a growth vessel, a method of controlling the As pressure, and a method of preventing vaporization of As by covering the surface of the melt with $B_2O_3$.

When the heat of the crucible is allowed to flow not only in the vertical direction but also in the lateral direction, that is, to the outside in the radial direction (circumferential direction), the interface of the part which is cooled in the circumferential direction precedes and the interface of the part facing the heater is delayed. When the shape of the interface between solid and melt is seen from the growth direction, therefore, the part of the recessed face and the part of the projected face mixtedly exist in the interface between solid and melt. In the shape, a crystal defect does not easily occur and the yield of single crystal growth largely increases as compared with the case where the face is recessed as a whole.

(2) There is also provided a method of fabricating a single crystal of a compound semiconductor according to the vertical Bridgman method of growing a single crystal by arranging a crucible on the inner side of a heater of a vertical electrical furnace and gradually solidifying a semiconductor melt from a lower part to an upper part in the crucible, wherein a part for discharging the heat of the crucible toward the outside in the radial direction is formed at least in a part in the circumferential direction of a heater part for controlling the interface between solid and melt in the heater which surrounds the crucible and the semiconductor melt is gradually solidified from a lower part to an upper part in the crucible while maintaining the interface between solid and melt in a saddle shape.

When the interface is formed in a saddle shape and is seen from the growth direction, the part of the recessed face and the part of the projected face mixtedly exist in the interface between solid and melt. In the shape, the crystal defect does not easily occur and the yield of single crystal growth largely increases as compared with the case where the interface has a recessed face as a whole.

Such a saddle-shaped interface can be obtained by forming a part for discharging the heat of the crucible toward the outside in the radial direction at least in a part in the circumferential direction of the heater part for controlling the interface between solid and melt in the heater surrounding the crucible. That is, by allowing the heat of the crucible to flow not only in the vertical direction but also in the circumferential direction (lateral direction), the interface of the part which is cooled in the circumferential direction precedes and the interface of the part which faces the heater is delayed, so that the saddle-shaped interface between solid and melt as shown in FIG. 1 can be realized.

(3) In each of the above methods, it is preferable to provide the parts for discharging the heat of the crucible toward the outside in the radial direction at two positions in the circumferential direction in the heater part for controlling the interface between solid and melt symmetrically with respect to the diameter direction. Thus, the interface can be formed in a symmetrical saddle shape.

(4) In each of the above methods, preferably, the part for discharging the heat of the crucible toward the outside in the radial direction is made by gaps of divided halves of the heater part which controls the interface between solid and melt. Although it is easy means, the interface can be formed in a saddle shape. The gaps in the circumferential direction of the halves of the heater are, in other words, the parts in which no heater exists in the circumferential direction and the heat of the crucible is discharged from the parts where there is no heater. By dividing the heater part into halves, the parts for discharging the heat of the crucible toward the outside in the radial direction exist in the symmetrical positions with respect to the diameter direction, so that the interface can be formed in a symmetrical saddle shape.

(5) In each of the above methods of fabricating a single crystal, the part for discharging the heat of the crucible toward the outside in the radial direction can be also realized by a cooling means provided in a part in the circumferential direction of the heater part for controlling the interface between solid and melt.

(6) There is also provided an apparatus for fabricating a single crystal of a compound semiconductor according to the vertical Bridgman method of growing a single crystal by arranging a crucible on the inner side of a heater of a vertical electrical furnace and gradually solidifying a semiconductor melt from a lower part to an upper part in the crucible, wherein at least a heater part for controlling the interface between solid and melt in the heater which surrounds the crucible is vertically divided into a plurality of parts and gaps for discharging the heat of the crucible to the outside in the radial direction are formed in a part in the circumferential direction of the heater part to allow the heat of the crucible to flow not only in the vertical direction but also from the gaps to the outside in the radial direction.

The gap in the circumferential direction of the heater is, in other words, a part where there is no heater in the circumferential direction and the heat of the crucible is discharged from the part where no heater exists. Consequently, the heat of the crucible is flowed not only in the vertical direction but also in the lateral direction, that is, to the outside in the radial direction (circumferential direction). The interface of the part which is cooled in the circumferential direction therefore precedes and the interface of the part which faces the heater is delayed. As a result, in the shape of the interface between solid and melt when it is seen from the growth direction, the part of the recessed face and the part of the projected face mixedly exist in the interface. In the shape, the crystal defect does not easily occur and the yield of single crystal growth largely increases as compared with at least the case where the interface has a recessed face as a whole.

(7) In the above apparatus, it is preferable that the heater part for controlling the interface between solid and melt is vertically divided into two parts. Although it is simple means, the interface can be formed in a saddle shape. The gap in the circumferential direction of the halves of the heater is, in other words, a part where there is no heater in the circumferential direction. The heat of the crucible is discharged from the part where there is no heater. By dividing the heater part into halves, the parts for discharging the heat of the crucible to the outside in the radial direction exist in positions which are symmetrical with respect to the diameter direction, so that the interface can be formed in a symmetrical saddle shape.

(8) There is also provided an apparatus for fabricating a single crystal of a compound semiconductor according to the vertical Bridgman method of growing a single crystal by arranging a crucible on the inner side of a heater of a vertical electrical furnace and gradually solidifying a semiconductor melt from a lower part to an upper part in the crucible, wherein cooling means for discharging the heat of the crucible to the outside in the radial direction are provided at positions symmetrical with respect to the diameter direction at least in a part in the circumferential direction of the heater part for controlling the interface between solid and melt in the heater which surrounds the crucible, so that the heat of the crucible flows not only in the vertical direction but also from the gaps to the outside in the radial direction.

By providing the cooling means as mentioned above, the heat of the crucible can be allowed to flow not only in the vertical direction but also in the lateral direction, that is, to the outside in the radial direction (circumferential direction). The interface of the part which is cooled in the circumferential direction precedes and the interface of the part which faces the heater is delayed. Consequently, the interface between solid and melt is formed in a shape where the part of the recessed face and the part of the projected face mixedly exist when it is seen from the growth direction. In the shape, the crystal defect does not easily occur and the yield of single crystal growth largely increases at least as compared with the case where the interface has a recessed face as a whole. The cooling means can be made by a part where a water-cooled tube is arranged or a part where an insulating material is removed.

MODES FOR CARRYING OUT THE INVENTION

Figure 1:
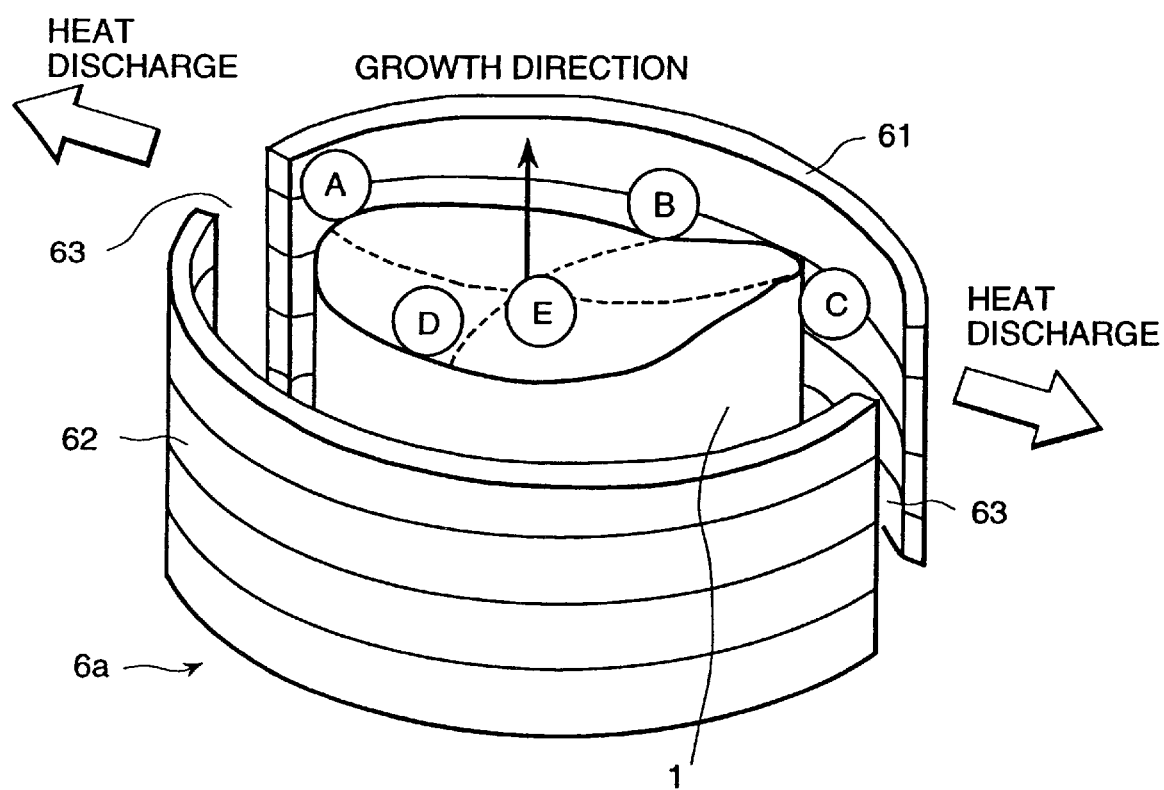
FIG. 1 is a perspective view showing a divided heater of a fabricating apparatus according to an embodiment of the invention and the shape of the interface between solid and melt.

The present invention will be described hereinbelow on the basis of an embodiment shown in the drawings.

Figure 2A:
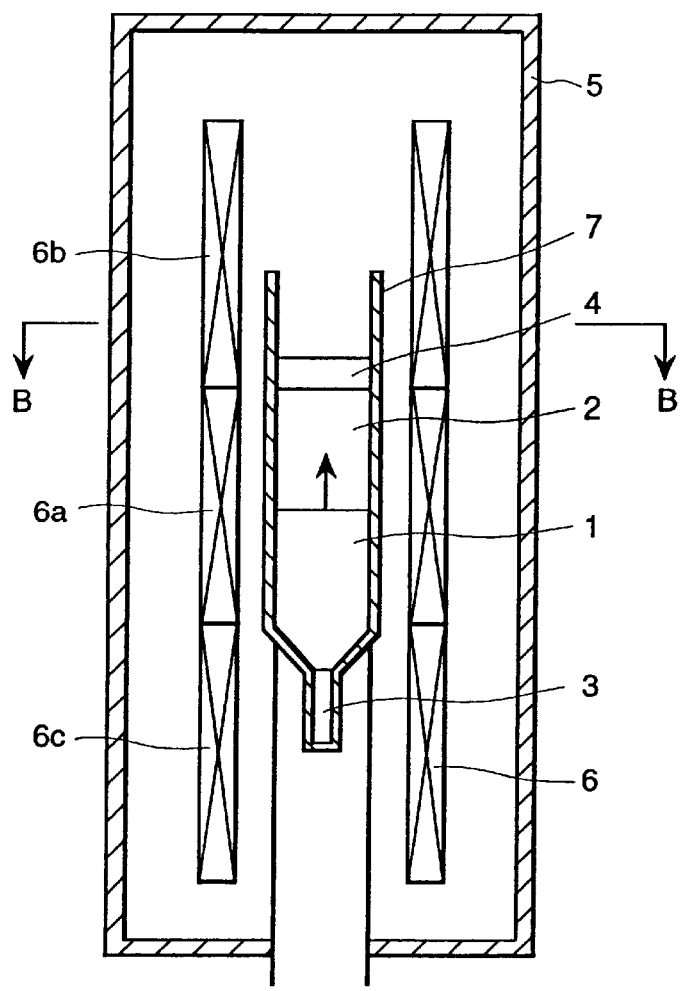
FIG. 2A is a vertical section of a single crystal fabricating apparatus according to the embodiment of the invention.
Figure 2B:
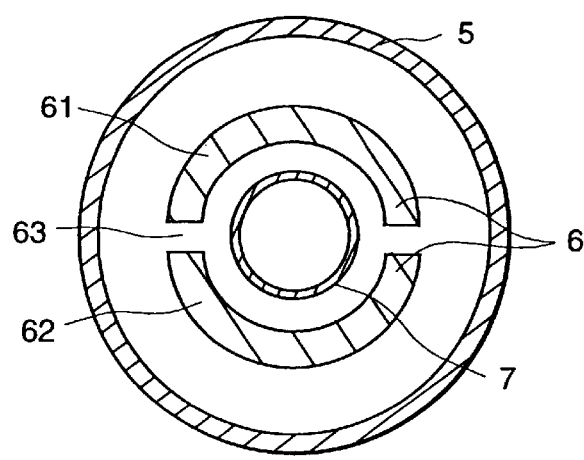
FIG. 2B is a transverse cross section taken along line B—B of FIG. 2A.

A case of using a VGF furnace shown in FIGS. 2A and 2B and growing a non-doped GaAs single crystal having the diameter of 3 inches in accordance with the VGF method will be described here as an embodiment.

A seed crystal 3 is arranged at the lower end of a crucible 7 made of PBN. The crucible 7 contains a GaAs polycrystal as a polycrystal material of a Group III-V compound. The crucible 7 is placed on a crucible supporting stand in a chamber 5 and is installed on the inner side of a heater 6 of a vertical electric furnace.

The heater 6 of the vertical electric furnace is made by a cylindrical heater arranged outside the crucible 7 so as to surround the crucible 7. The heater 6 has three stages in the vertical direction to form a predetermined temperature distribution having a temperature gradient in which the temperature is lower in a lower part than an upper part. That is, the heater 6 is constructed by: a heater 6a for controlling the position of the interface between solid and melt, which is placed in the center part serving as a heater part for controlling the interface between solid and melt and constructs the interface heating unit; a heater 6b for forming a melt, which is placed in the upper part and constructs a high-temperature heating part; and a heater 6c, which is placed in a lower part and constructs a low-temperature heating part.

In the heater 6, the heater 6a for controlling the position of the interface between solid and melt which is placed in the central part as a heater part for controlling the interface between solid and melt is vertically divided into two, that is, right and left parts which are divided pieces 61 and 62. Gaps 63 for discharging the heat of the crucible to the outside in the radial direction are formed between the divided pieces 61 and 62. The heat of the crucible 7 is therefore allowed to flow not only in the vertical direction but also in the direction toward the outside in the radial direction from the gaps 63 as shown by the arrows in FIG. 1.

The crystal is grown in such a manner that the GaAs polycrystal in the crucible 7 is melted by the heater 6 to form a GaAs melt 2 as a melt of the Group III-V compound and the heater 6 is gradually cooled down, thereby solidifying and growing a GaAs crystal 1 as a single crystal of the Group III-V compound having the same orientation as that of the seed crystal 3 from a lower part to an upper part in the crucible 7. A liquid encapsulating agent $B_2O_3$ 4 is charged on the GaAs melt 2, thereby preventing the dissociation of the GaAs melt 2.

As mentioned above, the heater 6a for controlling the interface between solid and melt is vertically divided to form the gaps 63 as parts in which there is no heater in the circumferential direction of the heater 6a, and the heat is escaped or discharged from the gaps 63 (two positions which are symmetrical with respect to the diameter direction). In this manner, the heat can be flowed not only in the direction from the upper to the lower but also in the circumferential direction (lateral direction).

When the GaAs single crystal is grown by using the fabricating apparatus having such a configuration, the interface of the part which is cooled in the circumferential direction precedes and the interface of the part which faces the heater is delayed. Consequently, the interface between solid and melt has a saddle shape as shown in FIG. 1. That is, in the shape of FIG. 1, a recessed face shown by A-E-C and a projected face shown by B-E-D are formed in the directions which perpendicularly cross each other.

When the interface has such a saddle shape and is seen from the growth direction (from above in FIG. 1), the recessed face part and the projected face part mixedly exist on the interface between solid and melt. In the shape, a crystal defect occurs less and the yield of single crystal growth largely increases at least as compared with a case where the interface between solid and melt has a recessed face as a whole.

It was found that, strangely, the degree of recess of the most recessed part (E part in FIG. 1) when the interface is formed in a saddle shape by using the heater 6 which is divided into halves becomes low as compared with that of the case where the rounded heater is used. That is, variation in the electrical characteristics of the plane when a wafer is formed becomes small as compared with that in a crystal grown by using a conventional rounded heater.

The optimum value of the width of the part where there is no heater in the circumferential direction, that is, the width of the gap 63 between the divided pieces 61 and 62 cannot be easily expressed by a numerical number. When it is too large, the recess and projection of the saddle shape become too large. When it is too small, the saddle shape cannot be obtained. The optimum value of the gap 63 changes according to the crystal size, that is, the heater size.

In any case, when the heater 6a divided into halves is used, the recess in the interface between solid and melt is improved. Consequently, advantages such that the yield of single crystal growth improves largely and a distribution of the electrical characteristics of the cut wafer surface becomes uniform can be obtained.

Embodiment

An embodiment will be described with reference to FIGS. 2A and 2B. The seed crystal 3, 3000 g of the GaAs material, a dopant Si and 200 g of $B_2O_3$ 4 were charged into a PBN crucible 7 having the inner diameter of ⌀80 mm. The crucible 7 was set in the electrical furnace. The heater 6 has an inner diameter of ⌀120 mm and is divided into halves. The width of the gap 63 where there is no heater was approximately 20 mm.

After $N_2$ gas substituted for the atmosphere gas in the chamber 5, the temperature was increased. The temperature gradient was adjusted to 4° C./cm, the material was melted, and the seed was dipped into the melt. After that, the temperature was decreased at 1° C./h to grow a crystal. After completion of the growth, the crystal was cooled to the room temperature at 25 to 100° C./h and then taken out.

As a result of similarly carrying out the growing operation ten times, the yield of single crystal growth reached 90%. When each of those single crystals was vertically sliced and the interface between solid and melt was observed by striation, it was found that the interface has a saddle shape as shown in FIG. 1.

When a wafer was cut from the crystal and variation in the carrier concentration of the plane was measured, it was found that the carrier concentration was at the level of $1.0 \times 18^{18}$ cm$^{-3}$ and the variation was within ±3%. It was found that the value was improved as compared with the following comparative example.

Comparative Example

A crystal was grown under that same conditions as those of the embodiment except that a rounded heater was used. As a result of repeatedly carrying out the growing operation ten times, the yield of single crystal growth was 60%. As a result of observing the interface between solid and melt, it was found that the recessed face was large as a whole. It was also found that a defect easily occurs from the part of meniscus which is in contact with the crucible by the influence.

When a wafer was cut and the carrier concentration of the plane was measured, it was found that the carrier concentration was at the level of $1.0 \times 18^{18}$ cm$^{-3}$ and the variation was +10%.

Modification

The present invention is not limited to the foregoing embodiment but also can be modified as below.

(1) All of compound semiconductors in addition to GaAs can be applied as a material of the crystal. As examples of the semiconductor materials which can be applied to the invention, Group III-V compounds such as GaAs, InAs, GaSb, InSb, GaP and InP, Group II-VI compounds such as CdTe, ZnSe, ZnS, and HgTe, Group IV elements such as Si and Ge, and mixed crystals each including one or more kinds of the above elements.

(2) Either the VB method or the VGF method can be applied.

(3) Although it is proper that the number of the vertical division of the heater, that is, the division in the circumferential direction of the heater is two, division of up to about four is considered to be effective to form the interface between solid and melt in the saddle shape. There is no point in dividing the heater more finely from the viewpoint of forming the interface between solid and melt in the saddle shape.

(4) Since the heater 6 is divided into halves in order to discharge the heat of the crucible from the parts in the circumferential direction where there is no heater (parts corresponding to the gaps 63) toward the outside in the radial direction, even if the rounded heater is used, by providing cooling means (for example, a water cooled tube is provided, a heat insulating material is partially removed, or the like) at the symmetrically positions in the circumferential direction, the heat can be also discharged in the circumferential direction (lateral direction). This belongs to the scope of the present invention.

(5) As mentioned above, since the optimum value of the width of the part where there is no heater in the circumferential direction of the heater (the part where the gap 63 exists or the part where the cooling means is arranged) changes according to the size of the single crystal to be obtained (the diameter of the heater 6) and the material and shape of an insulating material when a part where the insulating material on the circumferential face of the heater is removed as cooling means, it cannot be decided unconditionally. In any case, however, when the heater 6a which is divided into halves is used, the recessed plane of the interface between solid and melt is improved.

Consequently, advantages such that the yield of single crystal growth is largely improved and the distribution of the electrical characteristics of the plane of the cut wafer becomes uniform can be obtained.

As described above, according to the invention, the following excellent effects can be obtained.

(1) According to the method of fabricating a single crystal of the invention, the part for discharging the heat of the crucible toward the outside in the radial direction is formed at least in a part in the circumferential direction of the heater part for controlling the interface between solid and melt in the heater which surrounds the crucible and the single crystal is grown while discharging the heat of the crucible not only in the vertical direction but also to the outside in the radial direction. Consequently, the interface of the part which is cooled in the circumferential direction precedes and the interface of the part facing the heater is delayed. When the shape of the interface between solid and melt is seen from the growth direction, therefore, the part of the recessed face and the part of the projected face mixedly exist in the interface between solid and melt. In the shape of the interface between solid and melt, therefore, a crystal defect does not easily occur and the yield of single crystal growth largely increases as compared with the case where the interface is recessed as a whole. The distribution of the electric characteristics of the plane of the cut wafer becomes uniform.

(2) According to the method of fabricating a single crystal, the part for discharging the heat of the crucible toward the outside in the radial direction is formed at least in a part in the circumferential direction of the heater part for controlling the interface between solid and melt in the heater which surrounds the crucible and the single crystal is grown while maintaining the interface between solid and melt in a saddle shape. Consequently, when it is seen from the growth direction, the part of the recessed face and the part of the projected face mixedly exist in the interface between solid and melt. In the shape of the interface between solid and melt, therefore, the crystal defect does not easily occur and the yield of single crystal growth largely increases as compared with the case where the interface is recessed as a whole. The distribution of the electric characteristics of the plane of the cut wafer becomes uniform.

(3) According to the apparatus for fabricating the single crystal, at least the heater part for controlling the interface between solid and melt is vertically divided into a plurality of parts in the heater surrounding the crucible, the gaps for discharging the heat of the crucible to the outside in the radial direction are formed in a part of the heater part in the circumferential direction, and the heat of the crucible is allowed to flow not only in the vertical direction but also from the gaps to the outside in the radial direction. Consequently, the interface of the part which is cooled in the circumferential direction precedes and the interface of the part facing the heater is delayed. As a result, the interface between solid and melt has a shape in which the part of the recessed face and the part of the projected face mixedly exist when it is seen from the growth direction. In the shape of the interface between solid and melt, the crystal defect does not easily occur and the yield of single crystal growth largely increases as compared with a case where the interface between solid and melt is recessed as a whole. The distribution of the electric characteristics of the plane of the cut wafer becomes uniform.

What is claimed is:

1. An apparatus for fabricating a single crystal of a compound semiconductor according to a vertical Bridgman method of growing a single crystal by arranging a crucible on an inner side of a heater of a vertical electrical furnace and gradually solidifying a semiconductor melt from a lower part to an upper part in the crucible, wherein at least a heater part for controlling an interface between solid and melt in said heater which surrounds the crucible is vertically divided into a plurality of parts and gaps for discharging heat of the crucible to outside in a radial direction are formed in a part in a circumferential direction to allow the heat of the crucible to flow not only in a vertical direction but also from said gaps to the outside in the radial direction.

2. An apparatus according to claim 1, wherein the heater part for controlling said interface between solid and melt is vertically divided into two parts.

3. An apparatus according to claim 1, wherein the gaps, which are formed in the part in the circumferential direction, extend vertically.

4. An apparatus for fabricating a single crystal of a compound semiconductor according to a vertical Bridgman method of growing a single crystal by arranging a crucible on an inner side of a heater of a vertical electrical furnace and gradually solidifying a semiconductor melt from a lower part to an upper part in the crucible, wherein cooling means for discharging heat of the crucible to outside in a radial direction are provided at positions symmetrical with respect to a diameter direction at least in a part in a circumferential direction of a heater part for controlling the interface between solid and melt, so that the heat of the crucible flows not only in a vertical direction but also from said gaps to the outside in the radial direction.

5. An apparatus according to claim 4, wherein the cooling means is a part where a water-cooled pipe is arranged or a part where an insulating material is removed.

* * * * *